(12) United States Patent
Jin et al.

(10) Patent No.: US 8,384,447 B2
(45) Date of Patent: Feb. 26, 2013

(54) SEMICONDUCTOR APPARATUS AND METHOD FOR CONTROLLING THE SAME

(75) Inventors: Sin Hyun Jin, Icheon-si (KR); Sang Jin Byeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/584,519

(22) Filed: Aug. 13, 2012

(65) Prior Publication Data

US 2012/0306550 A1 Dec. 6, 2012

Related U.S. Application Data

(62) Division of application No. 12/651,018, filed on Dec. 31, 2009, now Pat. No. 8,274,316.

(30) Foreign Application Priority Data

Sep. 30, 2009 (KR) ........................ 10-2009-0093599

(51) Int. Cl.
*H03L 7/00* (2006.01)
(52) U.S. Cl. ...................................................... 327/143
(58) Field of Classification Search .................. 327/143
See application file for complete search history.

(56) References Cited

U.S. PATENT DOCUMENTS 7,639,052 B2 * 12/2009 Xiao et al. .................... 327/143

* cited by examiner

*Primary Examiner* — Lincoln Donovan
*Assistant Examiner* — Daniel Rojas
(74) *Attorney, Agent, or Firm* — William Park & Associates Ltd.

(57) ABSTRACT

A semiconductor apparatus comprises a power-up signal generation section configured to generate a power-up signal, a driver configured to drive and output the power-up signal, and a main circuit block configured to perform predetermined functions in response to an output from the driver, wherein the power-up signal generation section and an input terminal of the driver are connected by a disconnectable element.

4 Claims, 3 Drawing Sheets

SEMICONDUCTOR APPARATUS AND METHOD FOR CONTROLLING THE SAME

CROSS-REFERENCE TO RELATED APPLICATION

The present application claims priority under 35 U.S.C. §119(a) to Korean Application No. 10-2009-0093599, filed on Sep. 30, 2009, which is incorporated by reference in its entirety as if set forth in full.

BACKGROUND

1. Technical Field

Various aspects of the present disclosure generally relate to a semiconductor apparatus, and more particularly, to a semiconductor apparatus with a multi-chip package structure and a method for controlling the same.

2. Related Art

Semiconductor apparatuses are typically used in the form of multi-chip packages of at least two chips to improve integration efficiency.

In the multi-chip packages, a plurality of chips are connected using signal transmission elements, such as metal lines, bonding wires and through-silicon vias, so that signal transmission can be implemented between the chips.

In a semiconductor apparatus, it is important to implement power-up control, or control of determining whether a source voltage reaches a level capable of performing normal operations the semiconductor apparatus and thereby allowing various functions to be properly performed.

In a semiconductor apparatus with a multichip package structure, various kinds of chips are electrically connected using signal transmission elements. When the operational characteristics of devices constituting the respective chips are different, abnormal current paths are likely to be formed so that current consumption increases, and the reliability of the entire multi-chip package can deteriorate due to erroneous operation of a certain chip among the plurality of chips. This occurrence can cause various problems.

Therefore, the development of a technique for stable and efficient power-up control is demanded in the art.

SUMMARY OF THE INVENTION

Accordingly, there is a need for an improved semiconductor apparatus which can prevent the formation of an abnormal current path and the operation of a chip in an abnormal power supply state and a method for controlling the same.

An embodiment of the present invention may provide a semiconductor apparatus including a chip, the chip comprising: a power-up signal generation section configured to generate a power-up signal; a driver configured to drive and output the power-up signal; a main circuit block configured to perform predetermined functions in response to an output from the driver, wherein the power-up signal generation section and an input terminal of the driver are connected by a disconnectable element.

Another embodiment of the present invention may provide a semiconductor apparatus comprising: a master chip configured to generate a first power-up signal and inactivate the first power-up signal in response to a detection signal; a slave chip configured to generate a second power-up signal and generate the detection signal after detecting an inactivation of the second power-up signal.

Another embodiment of the present invention may provide a semiconductor apparatus comprising: a master chip configured to generate a first power-up signal and inactivate the first power-up signal in response to a plurality of detection signals; a plurality of slave chips configured to respectively generate second power-up signals and respectively generate the plurality of detection signals by respectively detecting deactivations of the second power-up signals.

Another embodiment of the present invention may provide a semiconductor apparatus comprising: a master chip configured to generate a first power-up signal and inactivate the first power-up signal in response to a detection signal; a slave chip configured to generate a second power-up signal and generate the detection signal after detecting an inactivation of the second power-up signal; a first through-silicon via connected between the master chip and the slave chip and supply the first power-up signal to the slave chip; and a second through-silicon via connected between the master chip and the slave chip and supply the detection signal to the master chip.

Another embodiment of the present invention may provide a method for controlling a semiconductor apparatus comprising a master chip and a slave chip comprises determining whether a power-up abnormality occurs in the slave chip; and interrupting operations of the master chip and the slave chip when it is determined that the power-up abnormality occurs in the slave chip.

Still another embodiment of the present invention may provide a method for controlling a semiconductor apparatus comprising a master chip and a plurality of slave chips, comprising: determining if one of power-up signals outputted from the plurality of slave chips is deactivated; and interrupting operations of the master chip and the plurality of slave chips when one of the power-up signals is deactivated.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a method for controlling the same according to the present disclosure will be described below with reference to the accompanying drawings through preferred embodiments.

Figure 1:
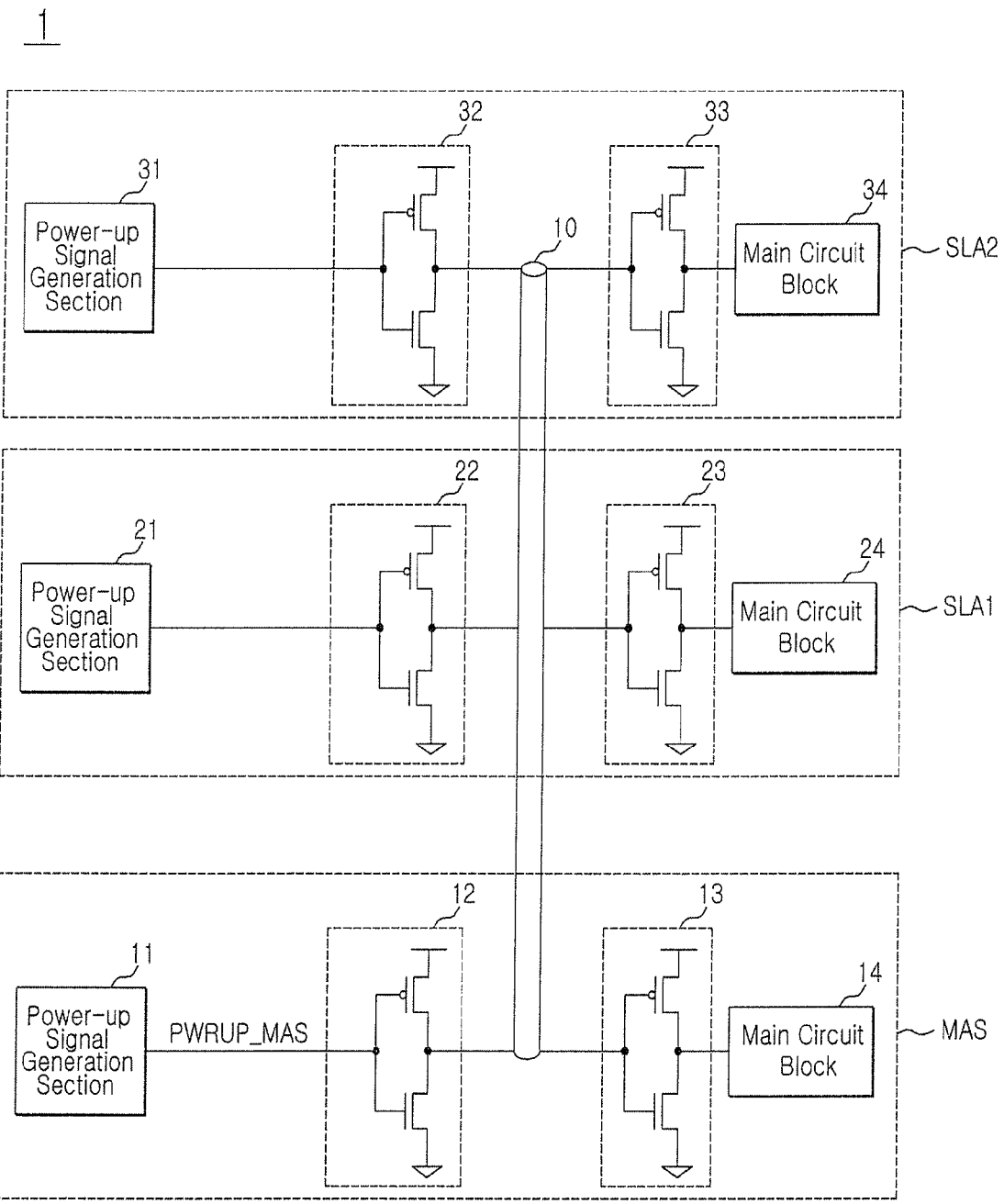
FIG. 1 is a block diagram illustrating a semiconductor apparatus in accordance with an embodiment of the present disclosure.

FIG. 1 is a block diagram illustrating a semiconductor apparatus in accordance with an embodiment of the present disclosure. Referring to FIG. 1, a semiconductor apparatus 1 according to the embodiment exemplifies a multi-chip package using three chips. One chip can comprise a master chip MAS and two remaining chips can comprise slave chips SLA1 and SLA2.

The master chip MAS comprises a power-up signal generation section 11, drivers 12 and 13, and a main circuit block 14.

The power-up signal generation section 11 is configured to output a power-up signal PWRUP_MAS that indicates whether the level of a source voltage VDD supplied from outside reaches a target level, or a voltage level appropriate for operations of the chips.

The main circuit block 14 is configured to perform the functions of the master chip MAS, and perform normal operations when the power-up signal PWRUP_MAS is a high level.

The drivers 12 and 13 are configured to transmit the power-up signal PWRUP_MAS to the main circuit block 14.

The slave chips SLA1 and SLA2 also comprise power-up signal generation sections 21 and 31, drivers 22 and 23, and 32 and 33, and main circuit blocks 24 and 34, respectively.

Before constructing the multi-chip package by connecting the master chip MAS and the slave chips SLA1 and SLA2 together using a through-silicon via 10, the master chip MAS and the slave chips SLA1 and SLA2 are separately tested. For this reason, each of the power-up signal generation sections 11 through 31 is necessary.

Alternatively, a bonding wire or a metal line may be used in place of the through-silicon via 10, depending upon the structure of a semiconductor apparatus.

After the construction of the multi-chip package is completed, the master chip MAS takes over the management of power-up control.

Accordingly, after all chip tests are completed separately, the output terminals of the drivers 12, 22 and 32 are connected together using the through-silicon via 10 such that the power-up signal PWRUP_MAS generated by the master chip MAS can be supplied commonly to the slave chips SLA1 and SLA2.

Figure 2:
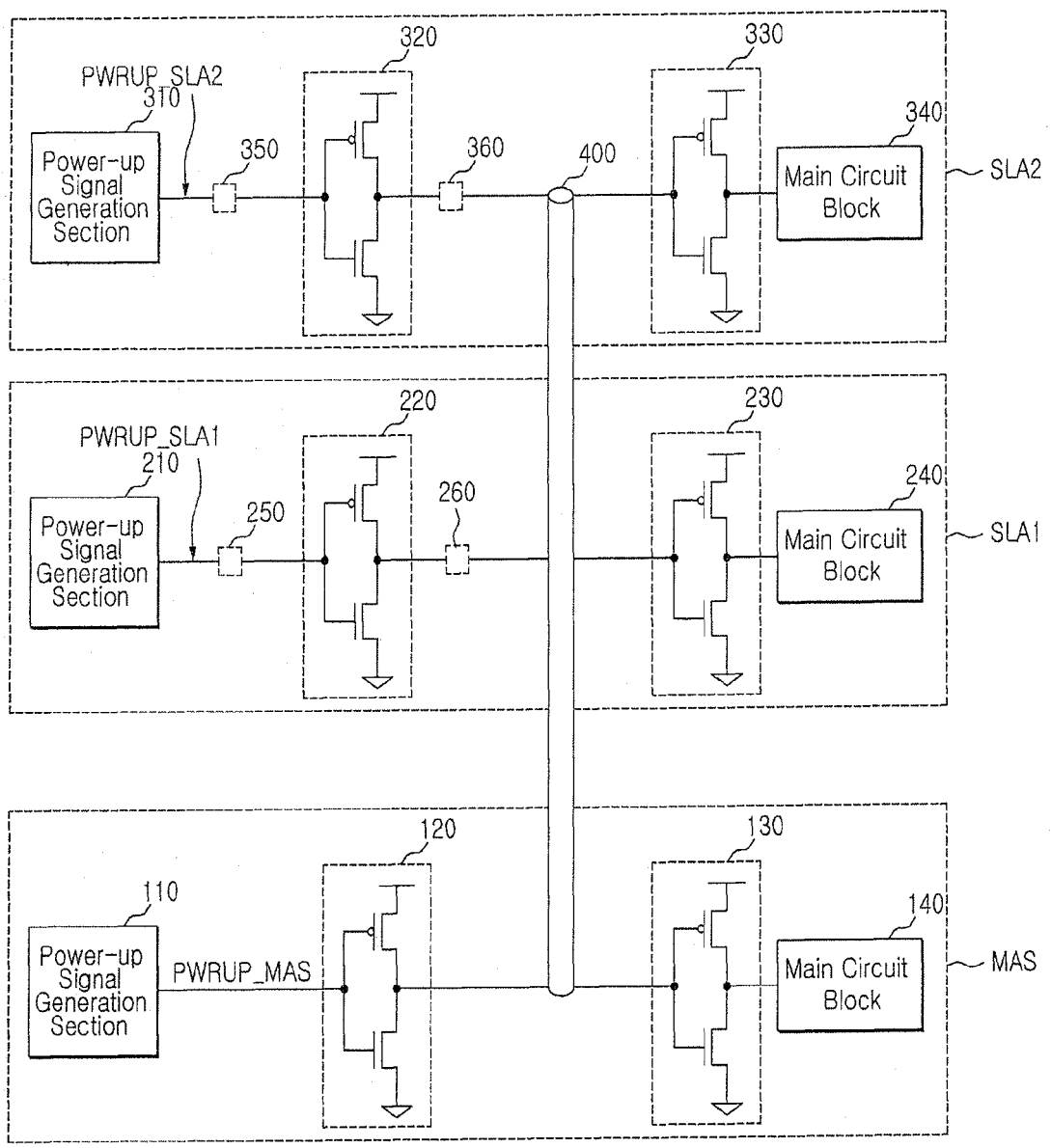
FIG. 2 is a block diagram illustrating a semiconductor apparatus in accordance with another embodiment of the present disclosure.

FIG. 2 is a block diagram illustrating a semiconductor apparatus 100 in accordance with another embodiment of the present disclosure. Referring to FIG. 2, the semiconductor apparatus 100 illustrates a multi-chip package comprising three chips. Here, the circuit components which will not be used after construction of the multi-chip package is completed are deactivated. One chip can comprise a master chip MAS and two remaining chips can comprise slave chips SLA1 and SLA2.

Since the master chip MAS takes over the management of power-up controls after the multi-chip package is manufactured, a power-up signal PWRUP_MAS generated by the master chip MAS should be transmitted to the slave chips SLA1 and SLA2. Therefore, the master chip MAS and the slave chips SLA1 and SLA2 are connected using a through-silicon via 400 as a signal transmission element. The through-silicon via 400 is an example of the signal transmission element, and a metal line or a bonding wire may also be to used alternatively.

The through-silicon via 400 is formed to commonly supply the power-up signal PWRUP_MAS generated by the master chip MAS to the slave chips SLA1 and SLA2.

The master chip MAS comprises a power-up signal generation section 110, drivers 120 and 130, and a main circuit block 140.

The power-up signal generation section 110 is configured to output a power-up signal PWRUP_MAS that indicates whether the level of a source voltage VDD supplied from outside reaches a target level, or a voltage level appropriate for operations of the chips. In this regard, it is assumed that the power-up signal generation section 110 outputs the power-up signal PWRUP_MAS at a high level when the level of the source voltage VDD is higher than the target level.

The main circuit block 140 is a circuit element which is necessary to perform the functions of the master chip MAS, and performs normal operations when the power-up signal PWRUP_MAS is high.

The drivers 120 and 130 are configured to transmit the power-up signal PWRUP_MAS to the main circuit block 140.

The slave chips SLA1 and SLA2 also comprise power-up signal generation sections 210 and 310, drivers 220 and 230, and 320 and 330, and main circuit blocks 240 and 340.

The slave chip SLA1 has fuses 250 and 260 between the power-up signal generation section 210 and the driver 220 and between the driver 220 and the main circuit block 240, respectively.

The slave chip SLA2 has fuses 350 and 360 between the power-up signal generation section 310 and the driver 320 and between the driver 320 and the main circuit block 340, respectively.

Alternatively, metal options may also be used in place of the fuses 250, 260, 350 and 360.

In the semiconductor apparatus 100 according to the embodiment of the present disclosure, the slave chips SLA1 and SLA2 are separately tested when the fuses 250, 260, 350 and 360 are connected.

The through-silicon via 400 is not formed at this time.

After tests are completed, the fuses 250, 260, 350 and 360 are cut off and the through-silicon via 400 is formed, so that the multi-chip package is constructed.

If the fuses 250, 260, 350 and 360 are cut, power-up signals PWRUP_SLA1 and PWRUP_SLA2 cannot be inputted to the drivers 220 and 320.

Therefore, during a normal operation after the construction of the multi-chip package, even when any one of the power-up signals PWRUP_MAS, PWRUP_SLA1 and PWRUP_SLA2 has a different level, it is possible to prevent the formation of an abnormal current path.

Figure 3:
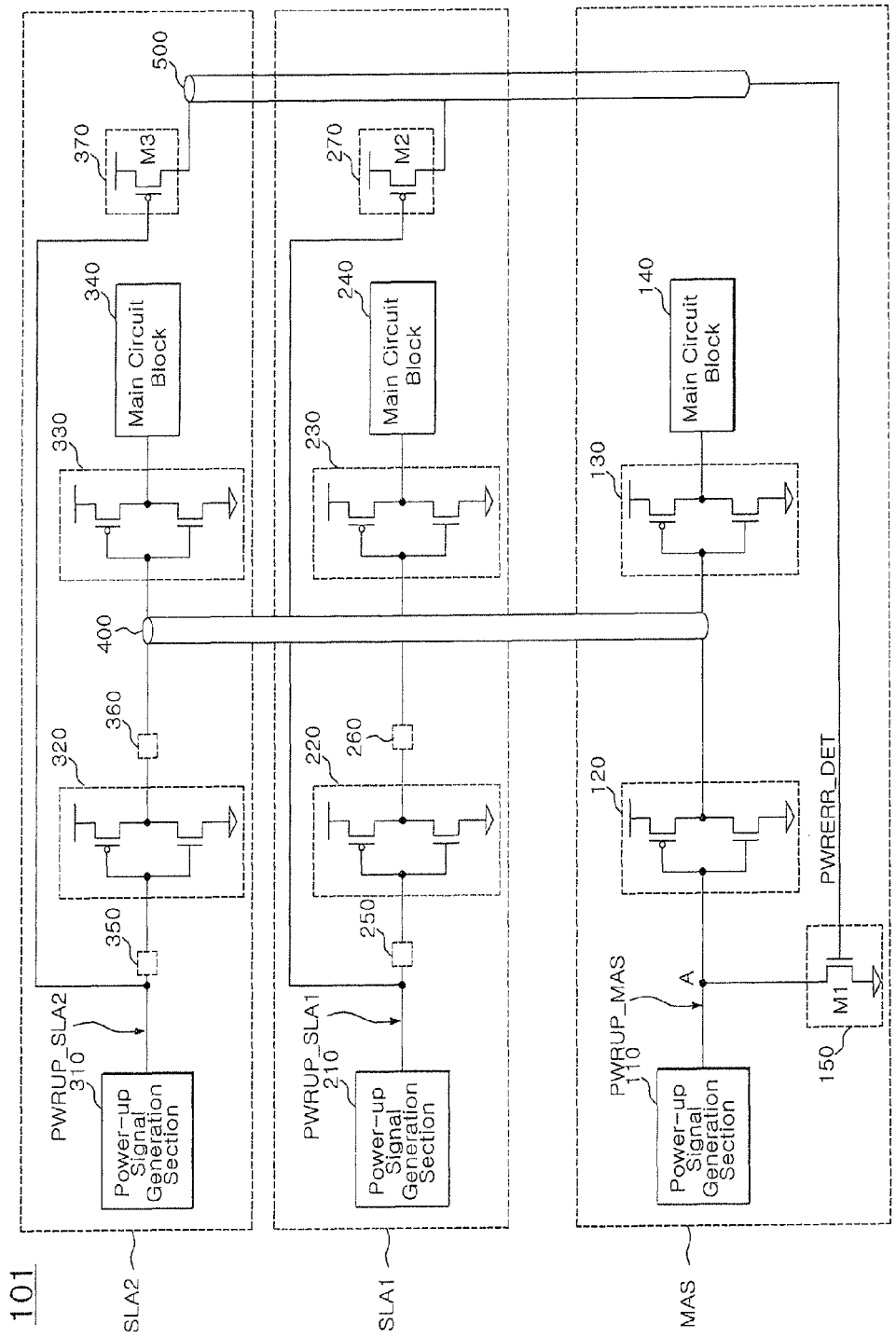
FIG. 3 is a block diagram illustrating a semiconductor apparatus in accordance with another embodiment of the present disclosure.

FIG. 3 is a diagram of a semiconductor apparatus 101 in accordance with another embodiment of the present disclosure that exemplifies the case of constructing a multi-chip package using three chips in a manner such that operations of all chips are interrupted when a power-up abnormality is detected. Among the three chips, one chip can comprise a master chip MAS and two remaining chips can comprise slave chips SLA1 and SLA2. At this time, the scheme as in the embodiment shown in FIG. 2 can be adopted together such that circuit components which will not be used after construction of the multi-chip package is completed are deactivated.

Since the master chip MAS should take over the management of power-up control after the manufacture of the multi-chip package is completed, a power-up signal PWRUP_MAS generated by the master chip MAS should be transmitted to the slave chips SLA1 and SLA2. Therefore, the master chip MAS and the slave chips SLA1 and SLA2 are connected using a through-silicon via 400 as a signal transmission element. The through-silicon via 400 is merely an example of the signal transmission element, and a metal line or a bonding wire can be used alternatively.

The through-silicon via 400 supplies the power-up signal PWRUP_MAS generated by the master chip MAS to the slave chips SLA1 and SLA2.

The master chip MAS comprises a power-up signal generation section 110, drivers 120 and 130, a main circuit block 140, and a control section 150.

The power-up signal generation section 110 is configured to output a power-up signal PWRUP_MAS that indicates whether the level of a source voltage VDD supplied from outside reaches a target level, or a voltage level appropriate for operations of the chips. In this regard, it is assumed that the power-up signal generation section 110 outputs the power-up signal PWRUP_MAS at a high level when the level of the source voltage VDD is higher than the target level.

The main circuit block 140 is configured to perform the is functions of the master chip MAS, and performs normal operations when the power-up signal PWRUP_MAS is a high level.

The drivers 120 and 130 are configured to transmit the power-up signal PWRUP_MAS to the main circuit block 140.

The control section 150 is configured to transit the power-up signal PWRUP_MAS to a deactivation level when the detection signal PWRERR_DET is activated. The control section 150 comprises a transistor M1. The source of the transistor M1 is grounded, the gate receives the detection signal PWRERR_DET, and the drain is connected to node A between the power-up signal generation section 110 and the driver 120.

The slave chip SLA1 comprises a power-up signal generation section 210, drivers 220 and 230, a main circuit block 240, fuses 250 and 260, and a detection section 270.

The power-up signal generation section 210, the drivers 220 and 230, the main circuit block 240, and the fuses 250 and 260 can be configured in a similar manner as shown in FIG. 2.

The detection section 270 is configured to detect a deactivation of the power-up signal PWRUP_SLA1 and activate the detection signal PWRERR_DET. The detection section 270 can comprise a transistor M2. In the transistor M2, the source receives the source voltage VDD, the gate receives the power-up signal PWRUP_SLA1, and the drain is connected to a through-silicon via 500.

The slave chip SLA2 comprises a power-up signal generation section 310, drivers 320 and 330, a main circuit block 340, fuses 350 and 360, and a detection section 370.

The power-up signal generation section 310, the drivers 320 and 330, the main circuit block 340, and the fuses 350 and 360 can be configured in a similar manner as shown in FIG. 2.

The detection section 370 is configured to detect aI deactivation of the power-up signal PWRUP_SLA2 and activate the detection signal PWRERR_DET. The detection section 370 can comprise a transistor M3. In the transistor M3, the source receives the source voltage VDD, the gate receives the power-up signal PWRUP_SLA2, and the drain is connected to the through-silicon via 500.

Alternatively, metal options may also be used in place of the fuses 250, 260, 350 and 360.

The detection signal PWRERR_DET generated by the slave chips SLA1 and SLA2 may be transmitted to the master chip MAS. Thus, the detection sections 270 and 370 of the slave chips SLA1 and SLA2 are connected to the control section 150 of the master chip MAS by the through-silicon via 500. A bonding wire may be used in place of the through-silicon via 500.

According to the embodiment of the present disclosure, the slave chips SLA1 and SLA2 in the semiconductor apparatus 101 are separately tested while the fuses 250, 260, 350 and 360 are connected.

The through-silicon vias 400 and 500 are not formed at this time.

After tests are completed, the fuses 250, 260, 350 and 360 are cut off and the through-silicon vias 400 and 500 are formed to construct the multi-chip package.

When the fuses 250, 260, 350 and 360 are cut off, power-up signals PWRUP_SLA1 and PWRUP_SLA2 cannot be inputted to the drivers 220 and 320.

Hence, during a normal operation after the construction of the multi-chip package, even when any one of the power-up signals PWRUP_MAS, PWRUP_SLA1 and PWRUP_SLA2 has a different level, it is possible to prevent the formation of an abnormal current path.

After the multi-chip package is constructed, the power-up signal PWRUP_MAS generated by the power-up signal generation section 110 of the master chip MAS is transmitted to the slave chips SLA1 and SLA2 by the through-silicon via 400.

That is to say, after the construction of the multi-chip package is finished, the operations of all the chips, that is, the master chip MAS and the slave chips SLA1 and SLA2 are controlled by the power-up signal PWRUP_MAS.

At this time, differences are likely to exist in the operational characteristics of devices constituting the master chip MAS and the slave chips SLA1 and SLA2. While the formation of an abnormal current path can be prevented by cutting off the fuses 250, 260, 350 and 360, there is no method for compensating the differences in the operational characteristics of the devices constituting the master chip MAS and the slave chips SLA1 and SLA2.

Thus, while the level of the source voltage VDD can be a level capable of activating the power-up signal PWRUP_MAS, that is, a level capable of ensuring the stable operation of the master chip MAS, the level of the source voltage VDD may not be a level capable of ensuring the stable operations of the slave chips SLA1 and SLA2.

Hence power-up abnormalities of the slave chips SLA1 and SLA2 are detected, so the operations of all the chips constituting the multi-chip package can be controlled.

When one of the power-up signals PWRUP_SLA1 and PWRUP_SLA2 outputted from the slave chips SLA1 and SLA2 is deactivated, or at a low level for example, it is assumed that the power-up signal PWRUP_SLA1 is a high level and the power-up signal PWRUP_SLA2 is a low level.

Because the power-up signal PWRUP_SLA2 is a low level, the high level signal outputted from the detection section 370 is supplied to the control section 150 of the master chip MAS by the through-silicon via 500 as the detection signal PWRERR_DET.

Since the detection signal PWRERR_DET is high, the transistor M1 of the control section 150 is turned on, and according to this, the power-up signal PWRUP_MAS transits to an inactivation level, that is, a low level.

The deactivated power-up signal PWRUP_MAS is supplied to all the main circuit blocks 140, 240 and 340.

As a consequence, all the main circuit blocks 140, 240 and 340 interrupt the operations of all the chips constituting the multi-chip package, that is, the master chip MAS and the slave chips SLA1 and SLA2, in response to the deactivated power-up signal PWRUP_MAS.

While certain embodiments have been described above, it will be understood to those skilled in the art that the embodiments described are by way of example only. Accordingly, the apparatus and method described herein should not be limited based on the described embodiments. Rather, the apparatus and method described herein should only be limited in light of the claims that follow when taken in conjunction with the above description and accompanying drawings.

What is claimed is:

1. A method for controlling a semiconductor apparatus comprising a master chip and a slave chip, comprising: determining whether a power-up abnormality occurs in the slave chip; and interrupting operations of the master chip and the slave chip when it is determined that the power-up abnormality occurs in the slave chip.

2. The method according to claim 1, wherein the determining whether a power-up abnormality occurs in the slave chip comprises: determining whether a power-up signal generated in the slave chip is deactivated.

3. The method according to claim 1, wherein whether the master chip and the slave chip are operated is commonly determined in response to a power-up signal generated in the master chip.

4. The method according to claim 3, wherein the interrupting operations of the master chip and the slave chip comprises: inactivating the power-up signal generated in the master chip.

* * * * *